United States Patent [19]
Colvin

[11] Patent Number: 5,764,409
[45] Date of Patent: Jun. 9, 1998

[54] ELIMINATION OF VIBRATION BY VIBRATION COUPLING IN MICROSCOPY APPLICATIONS

[76] Inventor: James Barry Colvin, 221 Ottawa Way, Fremont, Calif. 94539

[21] Appl. No.: 638,638

[22] Filed: Apr. 26, 1996

[51] Int. Cl.$^6$ .................. G02B 21/00; H01J 37/285; F16F 7/00
[52] U.S. Cl. .................. 359/382; 359/513; 359/823; 348/80; 324/750; 356/311; 267/140
[58] Field of Search .................. 359/382, 383, 359/611, 601, 507, 509–513, 823–826, 368; 348/80; 324/750; 356/311; 267/136, 139, 140

[56] References Cited

U.S. PATENT DOCUMENTS

| | | | |
|---|---|---|---|
| 1,889,794 | 12/1932 | Sabel | 359/656 |
| 3,716,999 | 2/1973 | Middelbeck | 267/140 |
| 4,025,171 | 5/1977 | Peck | 359/823 |
| 4,164,461 | 8/1979 | Schilling | 204/192 EC |
| 4,208,101 | 6/1980 | Trapp et al. | 359/656 |
| 4,357,203 | 11/1982 | Zelez | 156/643 |
| 4,556,317 | 12/1985 | Sandland et al. | 356/237 |
| 4,618,938 | 10/1986 | Sandland et al. | 364/552 |
| 4,680,635 | 7/1987 | Khurana | 358/211 |
| 4,722,298 | 2/1988 | Rubin et al. | 118/715 |
| 4,755,874 | 7/1988 | Esrig et al. | 358/106 |
| 4,772,846 | 9/1988 | Reeds | 324/158 F |
| 4,811,090 | 3/1989 | Khurana | 358/93 |
| 5,035,768 | 7/1991 | Mu et al. | 156/626 |
| 5,059,785 | 10/1991 | Doyle et al. | 250/309 |
| 5,296,704 | 3/1994 | Mishima et al. | 250/200 |
| 5,301,006 | 4/1994 | Bruce | 356/311 |
| 5,475,316 | 12/1995 | Hurley et al. | 324/750 |

OTHER PUBLICATIONS

J. Colvin, "Color Voltage Contrast: A New Method of Implementing Fault Contrast With Color Imaging Software", International Symposium for Testing and Failure Analysis, Nov. 1995.

J. Colvin, "Identification of Compromised Oxide Interfaces Using Noise Signature Techniques From a Constant Current Source", Proceedings of the 20th International Symposium for Testing and Failure Analysis, 13–18 Nov. 1994.

L. Baker et al., "A Simplified Application Of A Slow Scan CCD 'Astronomy' Camera To Emission Microscopy And Fluorescent Microthermography", The 20th International Symposium for Testing & Failure Analysis, 13–18 Nov. 1994.

The Micromanipulator Co. Inc., Model 8800 Series Tempseal and Dryer System, product brochure, (no date).
"Hypervision—The Leader in Emission Microscopy", Hypervision Corporation, (no date).

*Primary Examiner*—Jon W. Henry
*Attorney, Agent, or Firm*—Haverstock & Associates

[57] ABSTRACT

A portable emission microscope for analyzing failures in an integrated circuit chip while the chip is contained within a wafer sorter. A base for the microscope is placed over an opening in the wafer sorter. A translational apparatus is attached to the base for lowering a charge coupled device camera into an opening in the wafer sorter. A compact housing containing microscope optics is coupled to the camera. Also, a flexible rubber boot is coupled to the microscope optics for shielding extraneous light from entering the camera. A vibration reducing apparatus is coupled to the microscope optics for preventing movement of the camera relative to the chip. The vibration reducing apparatus fits within the rubber boot and is a rigid, hollow cylinder having an adjustable length. The microscope optics view the chip through the cylinder. The cylinder is adjusted such that when the camera is lowered into position over the chip, the microscope optics are an appropriate distance from the chip, the cylinder presses against, and firmly contacts, the surface surrounding the chip, preventing movement of the camera relative to the chip, while the rubber boot resiliently conforms to the surface surrounding the chip. A illumination system selectively illuminates the chip with one of two illumination sources. A first illumination source is a fibre optic ring housed within the rubber boot. A second illumination source illuminates the integrated circuit through the microscope objective lens.

14 Claims, 5 Drawing Sheets

ELIMINATION OF VIBRATION BY VIBRATION COUPLING IN MICROSCOPY APPLICATIONS

FIELD OF THE INVENTION

The invention relates to the field of portable emission microscopes for analysis of failures or defects occurring in integrated circuit chips. More particularly, the invention relates to the field of portable emission microscopes for analysis of failures or defects occurring in integrated circuits while contained within any of a variety of wafer sorters.

BACKGROUND OF THE INVENTION

During the manufacture of integrated circuit chips, one or more layers of silicon are applied to a wafer of silicon substrate. Generally, a layer of oxide is grown over each layer of silicon. The oxide layer is then photographically etched to selectively introduce impurities into the silicon before applying a successive layer of silicon. A metalization layer is applied to electrically interconnect various components of the wafer. Once this process is complete, the wafer is cut into portions, each portion comprising a single integrated circuit chip. Finally, each integrated circuit chip is packaged by attaching metallic pins to contact pads of the chip and by encapsulating the chip in a package.

A wafer sorter is generally utilized to test each integrated circuit chip for defects before the chip is packaged. An integrated circuit chip to be tested is placed upon a movable holder within the wafer sorter. Then, the chip under test is conveyed to a location directly below, and aligned with, an array of metallic contact fingers. The chip is raised, or the array of metallic contact fingers is lowered, such that the metallic contact fingers make electrical contact with contact pads of the integrated circuit chip. Test signals are then applied to the integrated circuit through the metallic contact fingers. The response of the integrated circuit to the test signals is detected and compared to an expected response to determine whether or not the chip is defective. Defective chips are rejected and non-defective chips are then packaged and retested by other testing apparatus.

It is well known that fault conditions or failures in integrated circuit chips can cause faint photon emissions which may be detected by an emission microscope. Such an emission microscope is described in co-pending U.S. patent application Ser. No. 08/555,186, filed on Nov. 8, 1995. Generally, for photon emissions to be detected, the integrated circuit chip must be in a stage of manufacture wherein the chip has not yet been packaged, or the package must be removed or opened, a process known as "de-lidding" the chip.

Images obtained from an emission microscope can be used to pin-point the location of a failure site in an integrated circuit chip under test. For example, the chip is placed beneath the objective lens of an emission microscope while a light shield prevents extraneous light from entering the emission microscope. An illuminated reference image of the integrated circuit chip is obtained with an illumination source turned on. A background image is obtained with the illumination source turned off. The integrated circuit is then biased with electrical test signals. Sites that emit photons (emission sites) form an emission image. The background image is subtracted from the emission image to filter background noise from the emission image. Then, the emission image is superimposed over the illumination image to determine the precise location of any emission sites. This information can aid in identifying the cause of a defect and, as such, can help identify faults in the design or manufacturing processes for the integrated circuit chips being tested.

Thus, while a wafer sorter sorts defective chips from non-defective chips, a wafer sorter generally provides little information that may aid in identifying the particular cause of a failure or defect. In contrast, an emission microscope can aid in identifying the cause of a failure or defect. Thus, it is desirable to perform emission microscopy on a chip found to be defective by a wafer sorter.

Once a chip is found to be defective, the chip may be removed from the wafer sorter and separately analyzed at an emission microscope test station. This, however, would require an additional test station and additional steps of removing the chip from the wafer sorter, re-installing the chip in the emission microscope test station and reapplying the test signals to the chip. Therefore, it is desirable to have an ability to utilize an emission microscope to pin-point the location of a defect while the defective chip is still under test in a wafer sorter, without the need for a separate emission microscope test station.

Unfortunately, many wafer sorters allow only limited access to the integrated circuit chip being tested. For example, an opening in the wafer sorter through which the chip may be viewed is often of limited size and disposed a considerable distance from the integrated circuit being tested. Further, emission microscopes of the prior art tend to be sizable, including large microscope optics, a sensitive camera and a bulky light tight housing which surrounds the emission microscope and the chip under test. Thus, it is often impractical to access an integrated circuit chip with a prior art emission microscope while the chip is contained within a wafer sorter.

Therefore, what is needed is an emission microscope having an ability to access an integrated circuit chip while the chip is contained within a wafer sorter, even if the wafer sorter is configured such that the chip is located a considerable distance from an opening in the wafer sorter.

Further, emission microscopes of the prior art tend to be costly to manufacture due to numerous components and complicated design.

Therefore, what is also needed is an emission microscope that has a simpler design and is less costly than emission microscopes of the prior art.

SUMMARY OF THE INVENTION

The invention is a portable emission microscope for analyzing failures in an integrated circuit chip while the integrated circuit chip is contained within a wafer sorter. A base for the emission microscope is placed over an opening in the wafer sorter. A translational apparatus is attached to the base for selectively adjusting the position of a camera coupled to the translational apparatus. The camera can be lowered into an opening in the wafer sorter by adjusting the translational apparatus, providing a deep drive capability for the emission microscope. A compact housing containing microscope optics is coupled to the camera, eliminating the need for conventionally bulky microscope optics. In addition, a flexible rubber boot is coupled to the microscope optics for shielding extraneous light from entering the camera. Because the rubber boot is flexible, it conforms to irregularities in the surface surrounding the integrated circuit chip.

A vibration reducing apparatus is coupled to the microscope optics for preventing movement of the camera relative to the integrated circuit chip being viewed. The vibration reducing apparatus fits within the rubber boot, or replaces the rubber boot, and is a rigid, hollow cylinder having an adjustable length. The microscope optics view the chip through the hollow cylinder. The cylinder is adjusted such that when the camera is lowered into position over the integrated circuit chip, the microscope optics are an appropriate distance from the chip, the cylinder presses against, and firmly contacts, the surface surrounding the chip, preventing movement of the camera relative to the chip, while the rubber boot resiliently conforms to the surface surrounding the chip, shielding out extraneous light.

A selective illumination system includes one or both of two illumination sources for selectively illuminating the integrated circuit. A first illumination source is a fibre optic ring housed within the rubber boot. A fibre optic link provides light to the fibre optic ring. A second illumination source illuminates the integrated circuit through the microscope objective lens. Light is directed to enter a housing for the microscope optics from an angle normal to the optical path of the microscope optics. A beam splitter element reflects the light along the optical path through the objective lens and towards the integrated circuit chip while preventing the light from traveling in a direction towards the camera. Once the light is reflected from the chip, the beam splitter permits the light to enter the camera.

DETAILED DESCRIPTION OF THE PREFERRED EMBODIMENT

Figure 1:
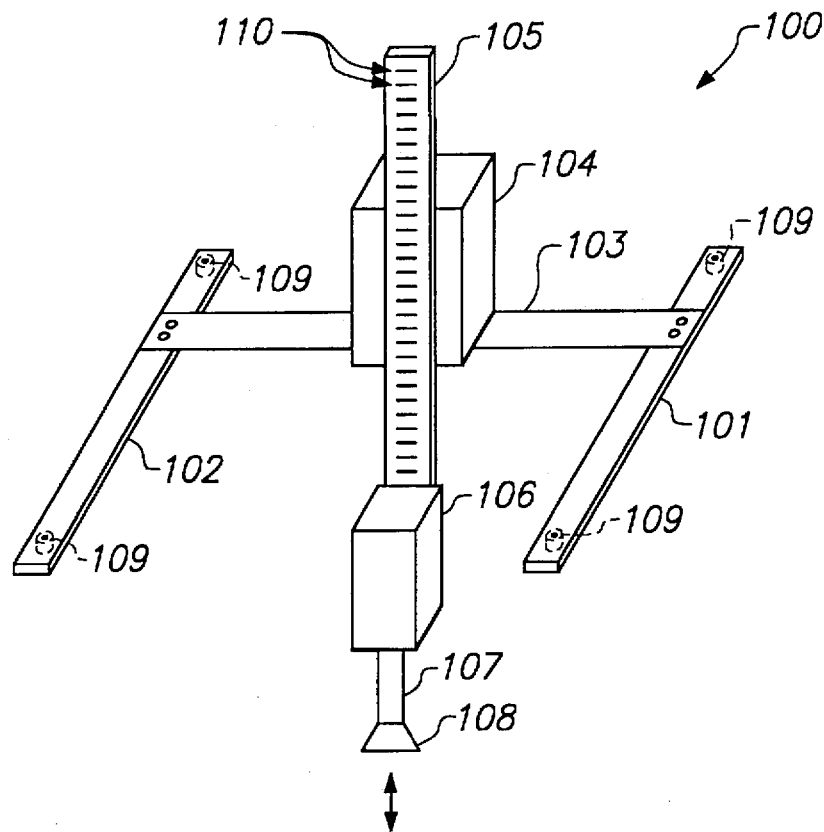
FIG. 1 illustrates a perspective view of the deep drive apparatus and camera of the present invention.

FIG. 1 illustrates a perspective view of a deep drive apparatus 100 of the present invention. A base includes side members 101, 102 coupled to a center member 103. A translational apparatus 104 is coupled to the center member 103. An extension member 105 is coupled to the translational apparatus 104. A camera 106 is coupled to the extension member 105. The camera 106 is preferably a charge coupled device (CCD) camera, or an intensified camera, for high sensitivity to photon emissions, but could be any suitable camera. A cylindrical housing 107 containing microscope optics is coupled to the camera 106. The microscope optics will be explained in more detail below with reference to FIGS. 3 and 9. A rubber boot 108 is coupled to the housing 107.

Figure 2:
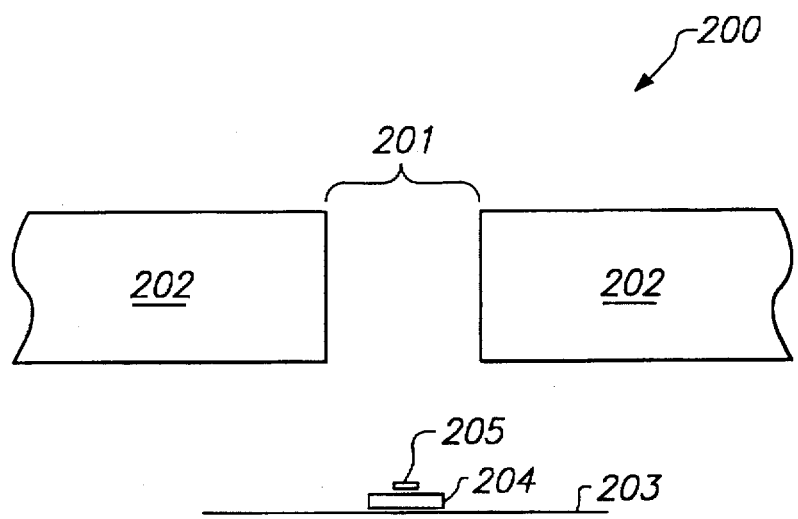
FIG. 2 illustrates a sectional view of a wafer sorter which can be used in conjunction with the deep drive apparatus of the present invention.

In operation, the deep drive apparatus 100 is placed on a surface with feet 109 contacting the surface. The feet 109 are preferably formed of nylon or hard plastic to reduce vibration, but can be formed of other materials. The camera 106 and microscope optics can then be lowered into an aperture in the surface for viewing an object below the surface. For example, FIG. 2 illustrates a sectional view of a wafer sorter 200 which can be used in conjunction with the deep drive apparatus 100 of the present invention. The wafer sorter 200 of FIG. 2 includes an aperture 201 in a structure 202. The structure 202 can contain circuits and other components of a conventional wafer sorter. The wafer sorter 200 also includes a stage 203 and a movable holder 204. The moveable holder 204 is configured to hold an integrated circuit chip under test 205. The wafer sorter 200 also includes a means for electrically coupling test signals to circuits contained in the integrated circuit chip 205, but such means is not shown.

The deep drive apparatus 100 of FIG. 1 is placed on the wafer sorter 200 such that the camera 106 is aligned with the aperture 201 of the wafer sorter 200. Then, the camera 107 is lowered down into the aperture 201 by adjusting the translational apparatus 104 until the rubber boot 108 makes sufficient contact with the stage 203 and/or the holder 204 to resiliently mold the flexible rubber boot 108 to any irregularities, thus, shielding the integrated circuit chip 205 and the microscope optics 107 from extraneous ambient light.

Preferably, the translational apparatus 104 has an ability to move the camera 106 both vertically and in a horizontal plane. Thus, the camera 106 can also be moved in a plane parallel to the stage 203 to align the microscope optics with the integrated circuit chip 205. As will be apparent, the amount of adjustment in the horizontal plane need not be as great as the amount of adjustment available in the vertical direction. Alternately, in a simpler, less expensive version of the deep drive apparatus 100, the translational apparatus 104 can only move the camera 106 vertically. It will be apparent, however, that to view the integrated circuit 205 without the ability to move the camera 106 horizontally, the entire deep drive apparatus 100 must be placed on the wafer sorter 200 such that the microscope optics are in close alignment with the integrated circuit 205.

The translational apparatus 104 can be any conventional apparatus for achieving the purposes of the translational apparatus 104 described herein. For example, movement in each of the X, Y and Z directions can be controlled by a user rotating one of three different handles coupled to gears contained within the translational apparatus 104 or movement can be controlled by electrical signals coupled to control motors and gears contained within the translational apparatus 104. As shown in FIG. 1, the extension member 104 can include perforations 110 for engaging the teeth of a gear contained within the translational apparatus 104. Further, the translational apparatus 104 preferably includes means for securing the position of the camera 106 once a desired position is achieved.

Figure 3:
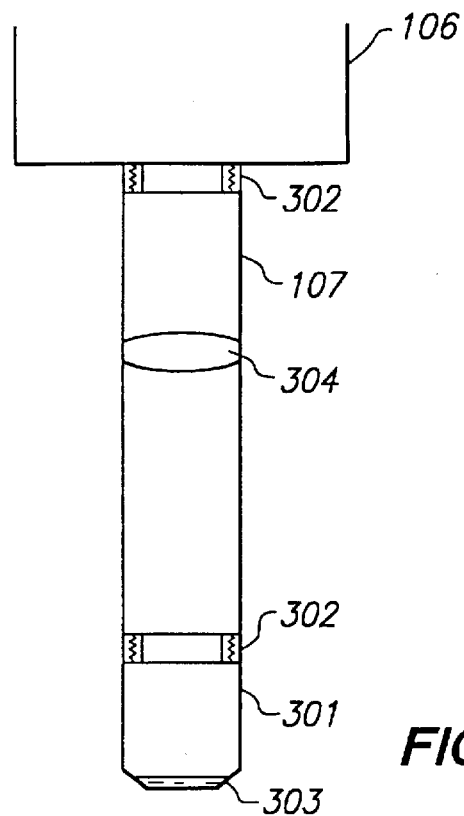
FIG. 3 illustrates a sectional view of the compact microscope optics and housing of the present invention.

FIG. 3 illustrates a sectional view of the compact microscope optics and housing 107 of the present invention. The housing 107 has threads 302 which engage corresponding threads on the camera 106 and microscope objective 301. Alternately, the threads 302 are replaced with quick-release clamps. The microscope objective 301 includes an objective lens 303. The housing 107 separates the camera 106 from the objective lens 303 by an appropriate distance for properly focusing on an object under view of the microscope and the housing includes a magnification lens 304.

Figure 4A:
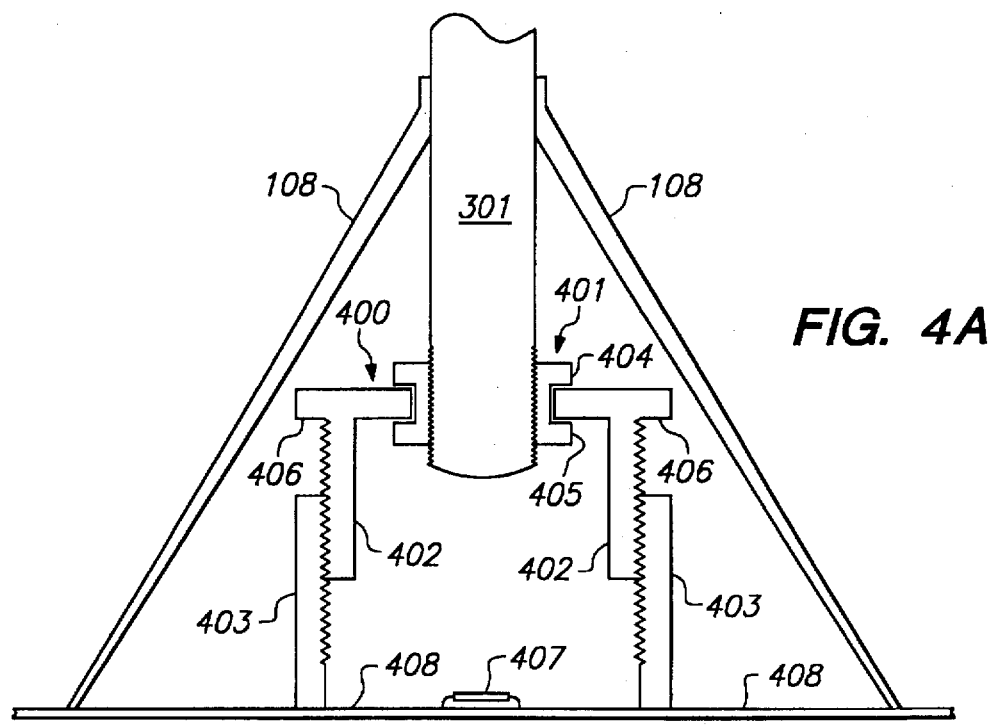
FIG. 4A illustrates a sectional view of the anti-vibration stabilizer and optional rubber boot of the present invention coupled to a microscope objective.

FIG. 4A illustrates a sectional view of an anti-vibration stabilizer 400 and optional rubber boot 108 of the present invention coupled to a microscope objective 301. The anti-vibration stabilizer 400 includes a collar 401, a first cylindrical member 402 and a second cylindrical member 403. The anti-vibration stabilizer 400 can be contained within the rubber boot 108, or can replace the rubber boot 108 by shielding out extraneous light.

The first cylindrical member 402 includes a crown 406 coupled to the collar 401 and is threaded about an outer surface of its cylindrical portion. The second cylindrical member 403 includes threads about an inner surface that engage the threads of the first cylindrical member 402.

The collar 401 is preferably coupled to the objective 301 by screw threads, but could be clamped to the objective 301. The collar 401 includes an upper shelf 404 and a lower shelf 405 for retaining the first cylindrical member 402 to the objective 301 while allowing the first cylindrical member 402 to rotate about the objective 301. The collar 401 could be formed of two separable pieces to simplify manufacture and installation wherein a first piece includes the upper shelf 404 and a second piece includes the lower shelf 405. In operation, the objective 301 is lowered over an integrated circuit under test 407 until a lower perimeter of the second cylindrical member 403 makes firm contact with a surface 408 surrounding the integrated circuit under test 407 and the rubber boot 108 makes resilient contact with the surface 408 to shield ambient light from the integrated circuit under test 407.

Alternately, the lower shelf 405 can be absent such that the first cylindrical member 406 can slide on or off of the collar 401. In operation, the first cylindrical member 402 and the second cylindrical member 403 are placed on the surface 408 over the integrated circuit 407. Then, the microscope objective 301 and collar 401 are lowered such that the collar 401 engages the first cylindrical member 402 and the lower surface of the second cylindrical member 403 makes firm contact with the surface 408. Note that this practice obviates the need to join the device under test 407 or its test bed to the microscope or camera such as with bolts, clamps, or the like.

Figure 8:
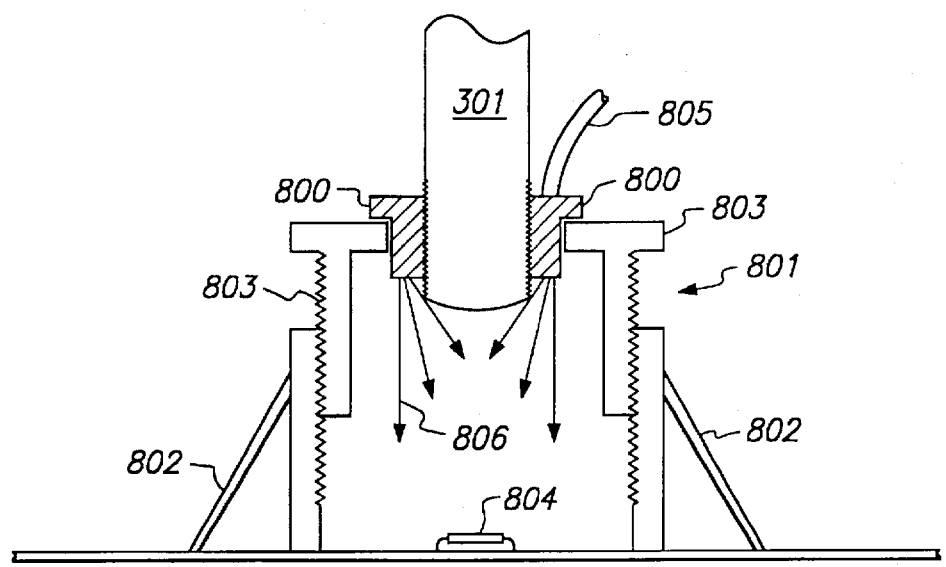
FIG. 8 illustrates a sectional view of the fibre optic illumination ring of the present invention used in conjunction with the anti-vibration stabilizer and optional rubber boot of the present invention all coupled to a microscope objective.

The threads of the first cylindrical member 402 and the second cylindrical member 403 allow the distance between the objective 301 and the surface 408 to be selectively adjusted for proper focusing by rotating the first cylindrical member 402 relative to the second cylindrical member 403. This can be accomplished by rotating the first cylindrical member 402 by hand or by providing a motor and gears (not shown) for remotely controlling this adjustment. Further, it will be apparent that the second cylindrical member 403 can be internal to the first cylindrical member 402.

Where the rubber boot 108 is utilized along with the anti-vibration stabilizer 400, it will be apparent that an adjustment of the anti-vibration stabilizer 400, can require that the rubber boot 108 be repositioned relative to the objective 301 in order to shield light from the integrated circuit under test 407. The rubber boot 108 can fit resiliently around the objective 301, being frictionally held in place, or can be attached to the objective 301 by a clamp, screws, or the like, and can have any suitable dimensions. As shown in FIG. 8, in an alternate embodiment of the rubber boot 802, rather than attaching to the microscope optics 301, the rubber boot 802 is attached to the anti-vibration stabilizer 801 forming a skirt around the anti-vibration stabilizer 801 to resiliently contact a surface surrounding the anti-vibration stabilizer to shield extraneous light from an integrated circuit under test 804.

The anti-vibration stabilizer 400 is preferably firmly pressed against the surface 408. Therefore, if the surface 408 or the objective 301 is subjected to vibration or jostling, the surface 408 and the objective 301 will move together and/or will inhibit the movement of each other. In this way, the integrated circuit under test 407 will remain stationary relative to the objective 301. Thus, the anti-vibration stabilizer 400 is preferably formed of a rigid material, such as metal or plastic. Preferably, a lower perimeter of the second cylindrical member 403 of the anti-vibration stabilizer 400 is coated with a material, such as teflon, to allow the anti-vibration stabilizer 400 to slide along the surface 407 for aligning the objective 301 with the integrated circuit under test 407. It will be apparent, however, that extremely violent movement can cause blurring in an image of the integrated circuit 408, as the anti-vibration stabilizer 400 is pressed against the surface 408, forming a static and/or dynamic frictional coupling, rather than being more rigidly affixed by means of clamp, screws, or the like. This frictional coupling is sufficient to protect against such movement as can be generally found in a production environment, such as vibration or jostling caused by motors or movement of workers and equipment, but also allows the anti-vibration stabilizer 400 to be slid along the surface 408 to align the objective 301 with the integrated circuit 407.

Alternately, the lower surface of the second cylindrical member 403 could be coated with a material, such as rubber, to increase the frictional coupling, as the circumstances require. In addition, where the anti-vibration stabilizer 400 is utilized without the rubber boot 108, a rubber coating on the lower surface of the second cylindrical member 403 can reduce the amount of extraneous light that enters the objective 301. It should be noted, however, that a thick layer of rubber can allow some motion of the device under test 407 relative to the camera.

The anti-vibration stabilizer 400 can be used in conjunction with the deep drive apparatus 100 described above, or can be used with any other apparatus for positioning a microscope relative to an object being viewed. When used with the deep drive apparatus 100, a portion the weight of the deep drive apparatus 100 is transferred from the surface upon which the deep drive apparatus 100 has been placed to the surface 408 surrounding the integrated circuit chip 407. Thus, the deep drive apparatus preferably has sufficient mass to ensure a firm frictional coupling between the feet 109 and the surface upon which the deep drive apparatus 100 has been placed and to ensure a firm frictional coupling of the anti-vibration stabilizer 400 to the surface 408. Alternately, the deep drive apparatus 100 could be more securely affixed to the surface upon which it has been placed by means of a clamp or the like.

Figure 4B:
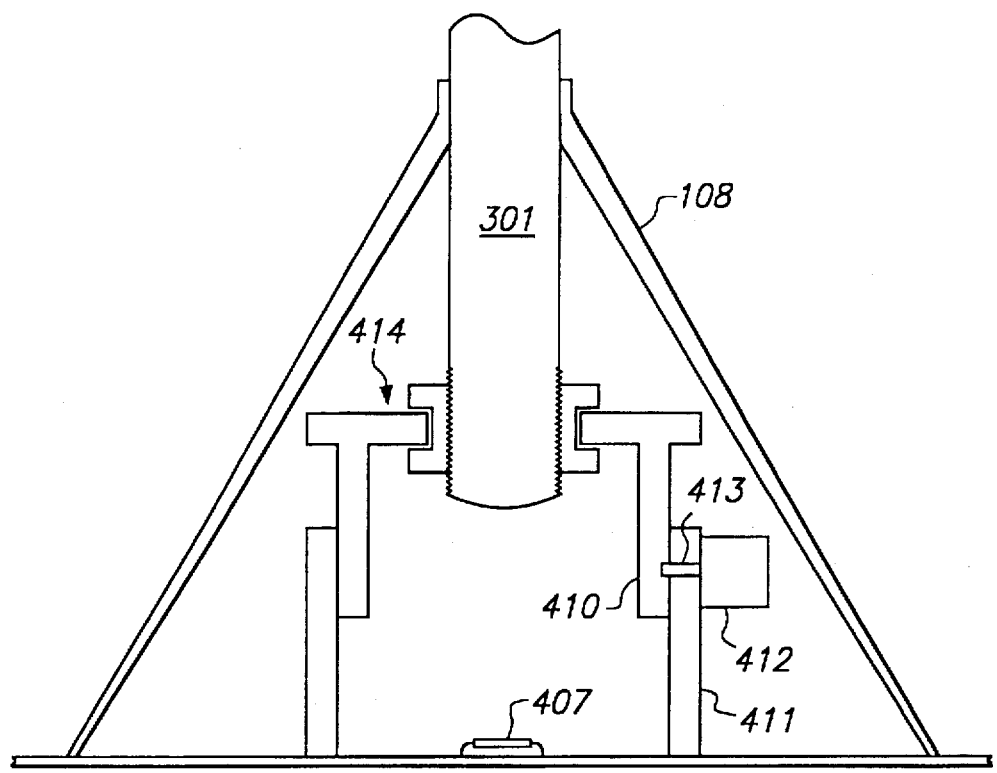
FIG. 4B illustrates a sectional view of a first alternate embodiment of the anti-vibration stabilizer and optional rubber boot of the present invention coupled to a microscope objective.

FIG. 4B illustrates a sectional view of a first alternate embodiment of the anti-vibration stabilizer and optional rubber boot of the present invention coupled to a microscope objective. Rather than utilizing threads to maintain the position of the first cylindrical member relative to the second cylindrical member, as in FIG. 4A, FIG. 4B shows that the first cylindrical member 410 and the second cylindrical member 411 are slidable relative to each other along substantially smooth surfaces. A solenoid 412 is remotely controlled to couple the first cylindrical member 410 to the second cylindrical member 411 with a pin 413 once proper positioning of the objective 301 relative to the integrated circuit 407 is achieved. Remote control of the solenoid 412 of FIG. 4B is particularly useful when access to the anti-vibration stabilizer 414 is restricted such that it would be difficult for a operator's hand to reach the anti-vibration stabilizer 414.

In operation, the first cylindrical member 410 is lowered relative to the second cylindrical member 411 until proper focusing is achieved while the second cylindrical member 411 rests on the surface 408. Then, the first cylindrical member 410 is raised such that focus is slightly lost and the solenoid 412 is actuated. Once the first cylindrical member 410 is fixed to the second cylindrical member 411, pressure can then be applied for frictionally coupling the anti-vibration stabilizer 414 to the surface 408. Application of pressure then regains proper focus.

Alternately, the pin 413 can be replaced with a set screw or other clamping means for coupling the first cylindrical member 410 to the second cylindrical member 411. It will be apparent that, to eliminate the rubber boot 108, the first cylindrical member 410 should engage the second cylindrical member 411 in manner that substantially blocks light from the integrated circuit 407. This can be accomplished by a tight fit or by a gasket, such as a rubber O-ring, between the first cylindrical member 410 and the second cylindrical member 411. As in FIG. 4A, the second cylindrical member 411 can be internal to the first cylindrical member 410.

Figure 4C:
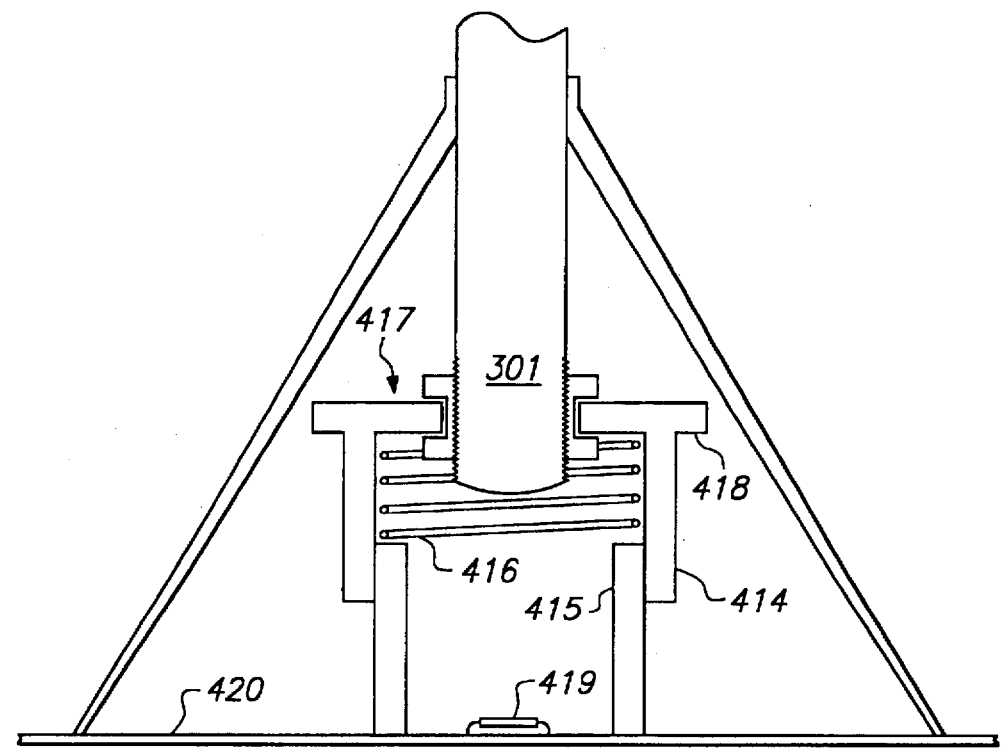
FIG. 4C illustrates a sectional of view of a second alternate embodiment of the anti-vibration stabilizer and optional rubber boot of the present invention coupled to a microscope objective.

FIG. 4C illustrates a sectional of view of a second alternate embodiment of the anti-vibration stabilizer and optional rubber boot of the present invention coupled to a microscope objective. Rather than the first cylindrical member being internal to the second cylindrical member as in FIGS. 4A and 4B, FIG. 4C shows that the first cylindrical member 414 is external to the second cylindrical member 415. The first cylindrical member 414 and the second cylindrical member 415 are slidable relative to each other along substantially smooth surfaces. A spring 416 is contained within the first cylindrical member 414 by the second cylindrical member 415. Thus, as the anti-vibration stabilizer 417 is elongated, the spring 416 expands, and as the anti-vibration stabilizer 417 is made shorter, the spring 416 is compressed. Preferably, a notch (not shown) in one of the first or second cylindrical members engages a corresponding protuberance (not shown) in the other cylindrical member to prevent them from separating entirely such that the spring 416 can become free of the anti-vibration stabilizer 417. In an alternate embodiment, the first cylindrical member 414 is internal to the second cylindrical member 415 and the spring 416 is wrapped around the external surface of the first cylindrical member 414. In which case, the spring 416 is retained by a shelf 418 in the crown of the first cylindrical member 414 and by the second cylindrical member 415.

In operation, the spring 416 is in an extended position as the objective 301 is lowered over an integrated circuit 419 and before the second cylindrical member 415 contacts the surface 420. After contact is made between the second cylindrical member 415 and the surface 420, the spring 416 is compressed as the position of the objective 310 is adjusted relative to the integrated circuit 419 for proper focus. The force required to compress the spring 416 is sufficient to establish a firm frictional coupling of the second cylindrical member 415 to the surface 420. Preferably, a force, aside from the force related to compression of the spring, is required to adjust the first cylindrical member 414 relative to the second cylindrical member 415. This can be achieved by a tight fit between the cylindrical members 414, 415 and by including coating of oil or grease between them or a bearing, such as a layer of teflon or nylon between them. In this way, the cylindrical members 414, 415 and spring 416 perform as a shock absorber to suppress vibration.

Figure 5:
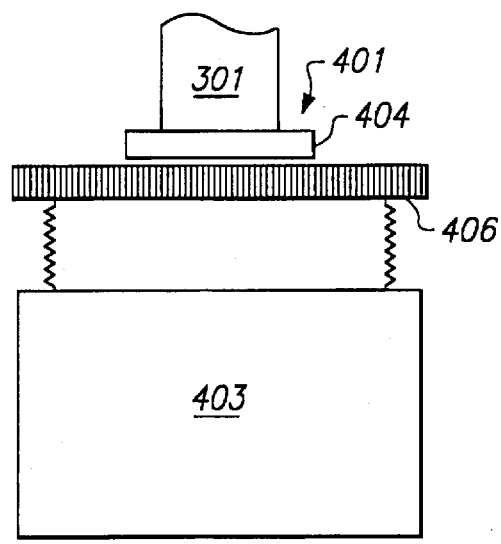
FIG. 5 illustrates a side elevational view of the anti-vibration stabilizer of the present invention coupled to a microscope objective.

FIG. 5 illustrates a side elevational view of the anti-vibration stabilizer 400 of the present invention coupled to a microscope objective 301. As shown in FIG. 5, the crown 406 of the first cylindrical member 402 can be knurled to ease adjustment of the anti-vibration stabilizer 400 by hand. Alternately, the crown 406 of the first cylindrical member 403 can include teeth for engaging corresponding teeth of a gear (not shown) for motorized adjustment of the anti-vibration stabilizer 400.

As will be apparent, the purposes of the anti-vibration stabilizer 400 can be accomplished by other configurations. For example, by omitting the collar 401 and coupling the first cylindrical member to the objective 301, adjustment is achieved by rotating the second cylindrical member. Further, the anti-vibration stabilizer 400 can include only one cylindrical member, such that the adjustment is achieved by appropriately positioning the cylindrical member relative to the objective 301 by means of threads on the objective 301 or a clamp. Additionally, a cylindrical member could be replaced with a member that is of another cross-sectional shape, or configuration. For example, FIG. 6 illustrates a side elevational view of the rubber boot 108 and an alternate embodiment of the anti-vibration stabilizer 600 of the present invention coupled to the microscope objective 301.

Figure 6:
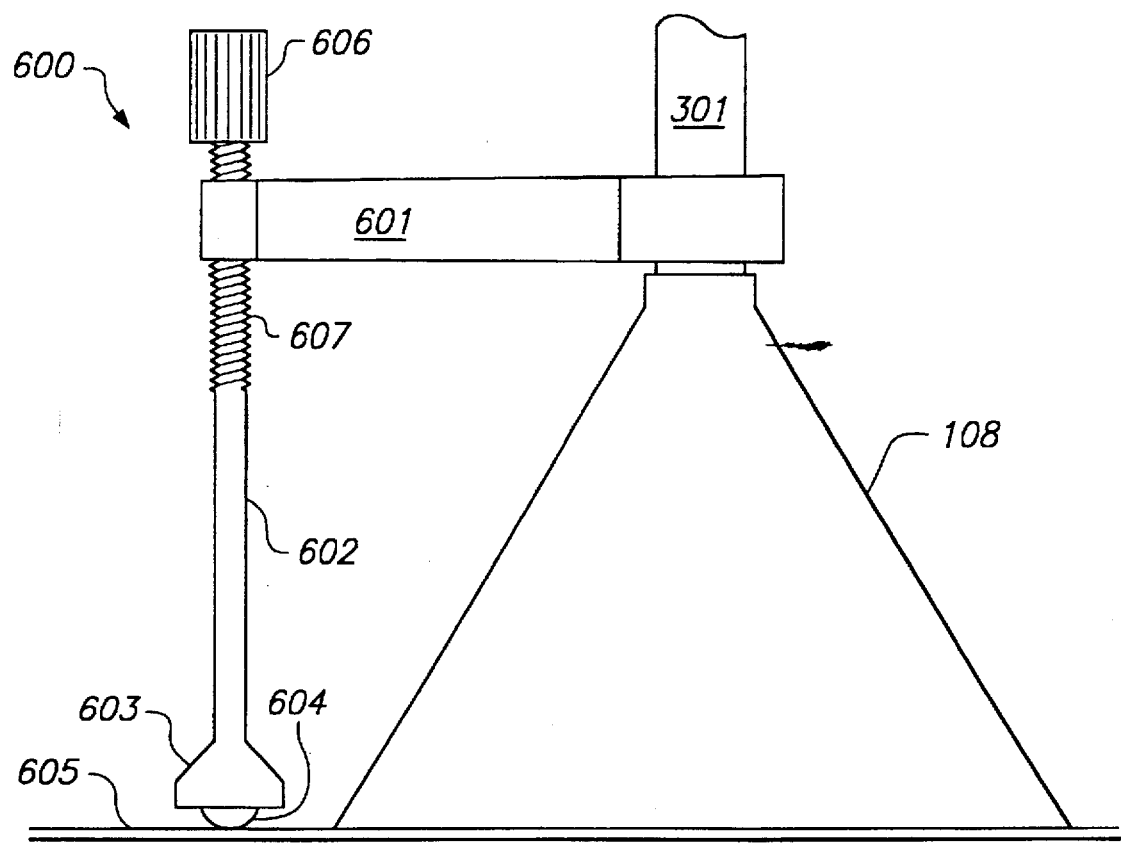
FIG. 6 illustrates a side elevational view of an alternate embodiment of the anti-vibration stabilizer and the rubber boot of the present invention coupled to a microscope objective.

Referring to FIG. 6, the anti-vibration stabilizer 600 is located outside the rubber boot 108 and comprises a bracket 601 that is clamped or threaded to the objective 301, a leg 602 and a foot 603. In operation, the objective 301 is lowered over an object to be viewed until the foot 603 of the anti-vibration stabilizer 600 makes firm contact with a surface 605 and the rubber boot 108 makes resilient contact with the surface 605 to shield ambient light from the object to be viewed.

The foot 603 can include a roller bearing 604 or can be coated with a material, such as teflon, to allow the objective 301 to be moved horizontally while the foot 603 contacts the surface 605. It will be apparent, however, that such an arrangement can reduce the ability of the anti-vibration stabilizer 600 to protect against horizontal movement of the objective 301 relative to the surface 605. Thus, the foot 603 can contact the surface 605 directly, without the roller bearing 605 or teflon coating, or can include a contacting surface formed of a material, such as a thin coating of rubber, for a more firm frictional coupling of the anti-vibration stabilizer 600 to the surface 605.

Preferably, the distance between the objective 301 and the surface 605 is selectively adjustable by rotating a knob 606 coupled to the leg 602. As the knob 606 is rotated, threads 607 on the leg 602 engage threads in the bracket 601, adjusting the position of the leg 602 relative to the bracket 601. Alternately, a motor could replace the knob 606, or the position of the bracket 601 relative to the objective 301 could be adjustable.

Figure 7:
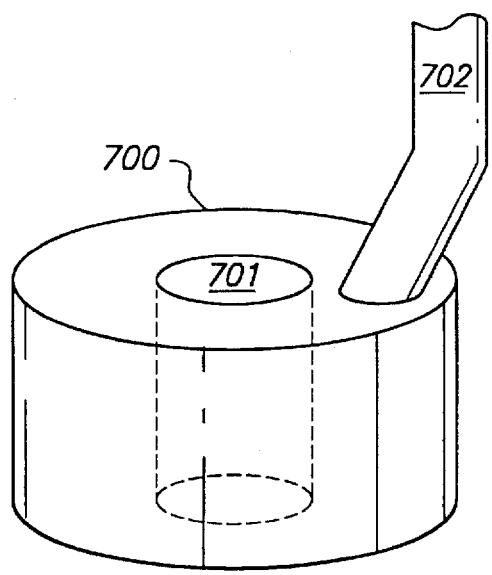
FIG. 7 illustrates a perspective view of the fibre optic illumination ring of the present invention.

FIG. 7 illustrates a perspective view of a fibre optic illumination ring 700 of the present invention. The illumination ring 700 is in the shape of a cylinder having a hollow center portion 701. Light enters the illumination ring 700 through a fibre optic link 702 and fills the illumination ring 700 with light. The light exits through an aperture in the coating as explained in more detail with reference to FIG. 8.

FIG. 8 illustrates a sectional view of an embodiment of the fibre optic illumination ring 800 of the present invention used in conjunction with an anti-vibration stabilizer 801 and rubber boot 802 of the present invention all coupled to a microscope objective 301. The fibre optic illumination ring 800 shown in FIG. 8, is notched to fit against the first cylindrical member 803 of the anti-vibration stabilizer 801.

In operation, the anti-vibration stabilizer 801 is placed over an integrated circuit 804 and the objective 301 is lowered until the fibre optic illumination ring 800 contacts the first cylindrical member 803 of the anti-vibration stabilizer 801. Alternatively, the fibre optic ring could be formed in two pieces such that a lower shelf of the fibre optic illumination ring 800 retains the first cylindrical member 803 of the anti-vibration stabilizer 801 to the objective 301, similarly to the collar 402 shown in FIG. 4A.

A coating is applied to the exterior of the illumination ring 800 except for a ring-shaped aperture in the coating at the bottom surface of the illumination ring 800. Light enters the illumination ring 800 through a fibre optic link 805. Light 806 exits the illumination ring 800 through the aperture in the coating to illuminate the integrated circuit under test 804. Light reflected from the integrated circuit 804 enters the objective 301.

FIG. 8 shows an embodiment of the rubber boot 802 coupled to the second cylindrical member 403, rather than to the objective 301, as in FIGS. 4A–C. The rubber boot 802 could, however, be coupled to the objective 301, as shown in FIGS. 4A–C, or could be omitted because the anti-vibration stabilizer 801 preferably shields sufficient extraneous light that the rubber boot 802 is not necessary.

Figure 9:
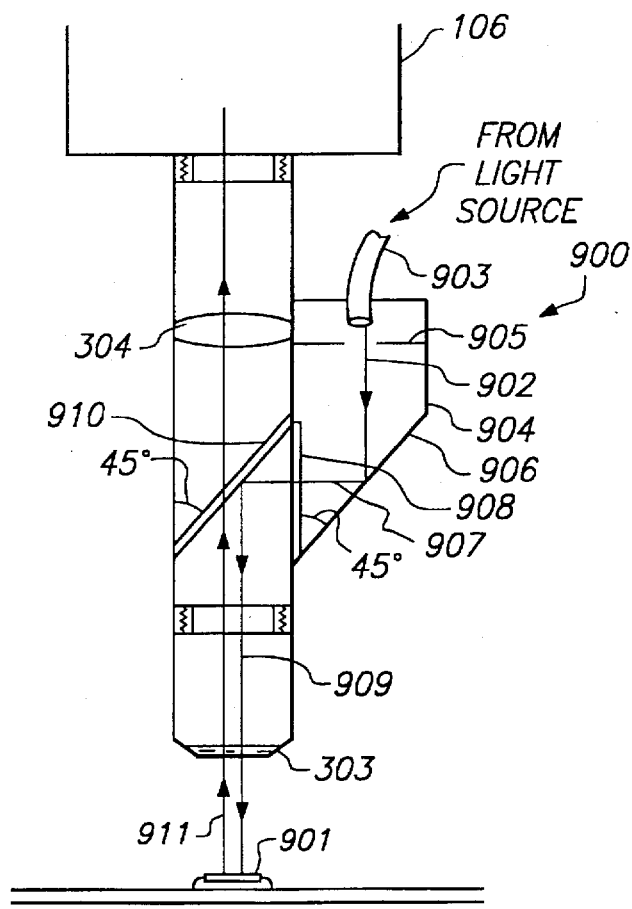
FIG. 9 illustrates a sectional view of the compact microscope optics and housing including the illumination source of the present invention for illuminating the integrated circuit under test through the microscope objective lens.

FIG. 9 illustrates a sectional view of an illumination source 900 of the present invention for illuminating the integrated circuit chip under test 901 through an objective lens 303 of the microscope. Light 902 from a light source, such as fibre optic link 903 enters a chamber 904 of the illumination source 900 through an iris diaphragm 905 and reflects off of a mirror 906. The mirror 906 is preferably positioned at a forty-five degree angle relative to a longitudinal axis of the microscope, as shown. Light 907 reflected from the mirror 906 passes through one or more condenser lenses 908.

Then, the light 909 is reflected off of a beam splitter element 910 and directed towards the objective lens 303. The beam splitter element 910 is preferably positioned parallel to the mirror 906 and at a forty-five degree angle relative to the longitudinal axis of the microscope, as shown. The light 909 exits the objective lens 303 and is reflected off of the object under view, such as an integrated circuit under test 901. Light 911 is reflected from the integrated circuit under test 901 towards the beam splitter element 910 and passes through the beam splitter element 910 and lens 304 providing an image of the integrated circuit under to test 901 to the camera 106.

In an emission microscope that includes both the fibre optic illumination ring 700, as shown in FIGS. 7–8, and the illumination source 900, as shown in FIG. 9, a means is provided for selecting between which of the two sources is operational. The means preferably includes a mechanical shutter which selectively directs light from a single light bulb to one of two different light paths. Alternately, the means is a pair of light bulbs or light emitting diodes, each of which is selectively energized to direct light to one of the two light paths. The light paths can each include a fibre optic link and/or reflective elements to direct the light from the light bulb(s) to the fibre optic link 702, shown in FIG. 7, or to the fibre optic link 905, shown in FIG. 9.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications can be made in the embodiments chosen for illustration without departing from the spirit and scope of the invention.

Specifically, it will be apparent to one of ordinary skill in the art that the device of the present invention could be implemented in several different ways and the apparatus disclosed above is only illustrative of the preferred embodiment of the invention and is in no way a limitation. For example, it would be within the scope of the invention to vary the dimensions and angles disclosed herein. In addition, it will be apparent that the various aspects of the above-described invention can be utilized singly or in combination with one or more of the other aspects of the invention described herein, or with other types of microscopes. In addition, the various aspects of the present invention could be practiced with circuit testers of various types, such as a test head for testing packaged integrated circuits, in addition to a wafer sorter.

What is claimed is:

1. A vibration reducing stabilizer for a microscope comprising:
   a. an internally threaded hollow cylinder;
   b. an externally threaded hollow cylinder threaded to the internally threaded hollow cylinder wherein the internally threaded hollow cylinder and the externally threaded hollow cylinder form an adjustable hollow cylinder having a selectively adjustable length, further wherein the length is a distance between an objective of a microscope and an object under view; and
   c. means for coupling the adjustable hollow cylinder to the objective wherein a longitudinal axis of the adjustable hollow cylinder is aligned with the objective.

2. The vibration reducing stabilizer according to claim 1 further comprising means for pressing the adjustable hollow cylinder against a surface for reducing movement of the objective relative to the surface.

3. The vibration reducing stabilizer according to claim 1 further comprising means for frictionally coupling the adjustable hollow cylinder to a surface for reducing movement of the objective relative to the surface.

4. The vibration reducing stabilizer according to claim 1 wherein the microscope is an emission microscope.

5. The vibration reducing stabilizer according to claim 4 further comprising a rubber boot coupled to the objective for preventing extraneous light from entering the objective.

6. A vibration reducing stabilizer for a microscope comprising:
   a. a first cylinder;
   b. a second cylinder coupled to the first cylinder wherein the first cylinder and the second cylinder form a third cylinder having a selectively adjustable length, wherein the length is a distance between an objective of a microscope and an object under view; and
   c. means for coupling the first cylinder to the objective wherein a longitudinal axis of the third cylinder is aligned with the objective.

7. The vibration reducing stabilizer according to claim 6 further comprising means for pressing the third cylinder against a surface for reducing movement of the objective relative to the surface.

8. The vibration reducing stabilizer according to claim 6 further comprising means for frictionally coupling the third cylinder to a surface for reducing movement of the objective relative to the surface.

9. The vibration reducing stabilizer according to claim 6 wherein the microscope is an emission microscope.

10. The vibration reducing stabilizer according to claim 9 further comprising a rubber boot coupled to the objective for preventing extraneous light from entering the objective.

11. A vibration reducing stabilizer for a microscope comprising:

a. a hollow body having a first aperture and a second aperture wherein the first aperture is separated from the second aperture by a distance between an objective of a microscope and an object under view;

b. means for coupling the objective to the hollow body wherein the objective is aligned with the first aperture and the second aperture; and c. means for frictionally coupling the hollow body to a surface for reducing movement of the objective relative to the surface.

12. The vibration reducing stabilizer according to claim 11 wherein the microscope is an emission microscope.

13. The vibration reducing stabilizer according to claim 12 further comprising a rubber boot coupled to the objective for preventing extraneous light from entering the objective.

14. The vibration reducing stabilizer according to claim 11 wherein the distance is selectively adjustable.

* * * * *

UNITED STATES PATENT AND TRADEMARK OFFICE
CERTIFICATE OF CORRECTION

PATENT NO. : 5,764,409
DATED : June 9, 1998
INVENTOR(S) : James Barry Colvin

It is certified that error appears in the above-indentified patent and that said Letters Patent is hereby corrected as shown below:

Title page, item [73], Assignee: should read-- Alpha Innotech Corporation
San Leandro, California --

Signed and Sealed this

Twenty-first Day of September, 1999

Attest:

Q. TODD DICKINSON

Attesting Officer

Acting Commissioner of Patents and Trademarks